United States Patent
Schwabe

(10) Patent No.: US 7,586,338 B2
(45) Date of Patent: Sep. 8, 2009

(54) INCREASING THE AVAILABILITY AND REDUNDANCY OF ANALOG CURRENT OUTPUTS

(75) Inventor: Dietmar Schwabe, Neumark (DE)

(73) Assignee: Siemens Aktiengesellschaft, Munich (DE)

( * ) Notice: Subject to any disclaimer, the term of this patent is extended or adjusted under 35 U.S.C. 154(b) by 188 days.

(21) Appl. No.: 11/899,554

(22) Filed: Sep. 6, 2007

(65) Prior Publication Data

US 2008/0073976 A1    Mar. 27, 2008

(51) Int. Cl.
H03K 17/00 (2006.01)
G06F 1/08 (2006.01)

(52) U.S. Cl. .............................. 327/99; 327/57; 327/58; 327/64; 327/65; 327/108; 327/530

(58) Field of Classification Search ................. 327/530, 327/108, 57, 58, 64, 65
See application file for complete search history.

(56) References Cited

U.S. PATENT DOCUMENTS

| 4,967,140 | A  | * | 10/1990 | Groeneveld et al. | 323/315 |
| 6,590,441 | B2 | * | 7/2003 | Papathanasiou | 327/530 |
| 6,795,009 | B2 | * | 9/2004 | Duffy et al. | 341/155 |
| 7,382,153 | B2 | * | 6/2008 | Ou-yang et al. | 326/30 |
| 7,440,342 | B2 | * | 10/2008 | Pan | 365/189.09 |
| 7,443,212 | B2 | * | 10/2008 | Hayashi et al. | 327/108 |
| 7,514,989 | B1 | * | 4/2009 | Somerville et al. | 327/543 |
| 2004/0201507 | A1 |  | 10/2004 | Boxho | |
| 2007/0158776 | A1 | * | 7/2007 | Julio et al. | 257/486 |
| 2008/0290908 | A1 | * | 11/2008 | Tretter | 327/108 |
| 2009/0015454 | A1 | * | 1/2009 | Sugai | 341/144 |
| 2009/0051416 | A1 | * | 2/2009 | Ibuka | 327/538 |
| 2009/0091359 | A1 | * | 4/2009 | Uchida et al. | 327/108 |

FOREIGN PATENT DOCUMENTS

| DE | 10 2004 005 138 A1 | 6/2005 |
| EP | 0 399 725 A1 | 11/1990 |
| WO | WO 01/31790 A1 | 5/2001 |

* cited by examiner

Primary Examiner—Lincoln Donovan
Assistant Examiner—Adam D Houston

(57) ABSTRACT

There is described a method for increasing an availability and a redundancy of an analog current output as well as an analog current output with increased availability and redundancy. To improve the availability and also the redundancy behavior of an analog current output a first set of current sources is switched to active to generate an output current, one current source respectively of the first set is checked cyclically for serviceability and the other current sources respectively generate the output current in equal parts. Where unserviceability is determined, the corresponding current source is disconnected and removed from the first set. If a malfunction occurs, such as a failure of a current source for example, the output current advantageously does not drop out completely due to the allocation of generation to a number of current sources. The cyclical checking of the current sources allows the unserviceable current source to be removed quickly from the first set, with the remaining current sources still being able to supply the full output current, without being exposed to a greater load due to increased energy output. Error identification and switching therefore take practically no time, resulting in a continuous flow of current without interruptions.

20 Claims, 1 Drawing Sheet

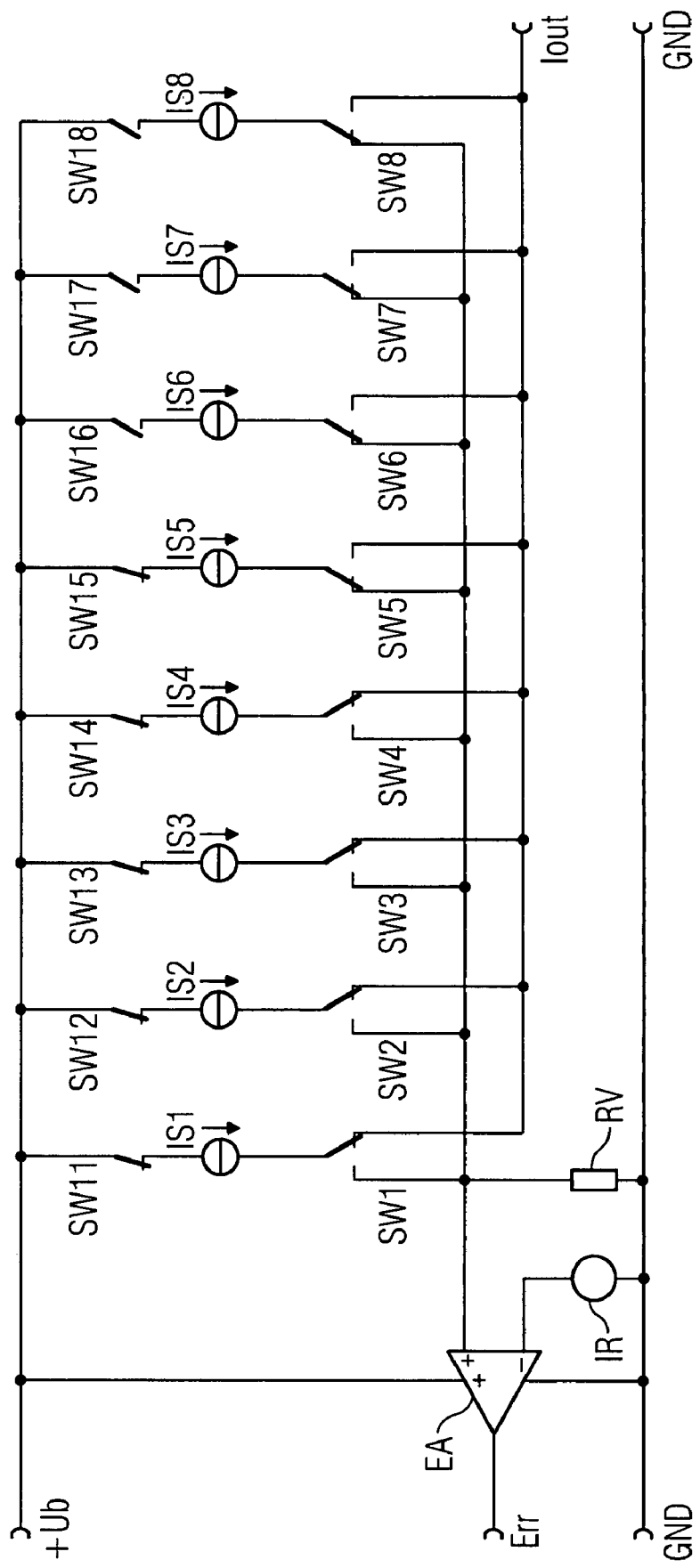

INCREASING THE AVAILABILITY AND REDUNDANCY OF ANALOG CURRENT OUTPUTS

CROSS REFERENCE TO RELATED APPLICATIONS

This application claims priority of European application No. 06019938.7 EP filed Sep. 22, 2006, which is incorporated by reference herein in its entirety.

FIELD OF INVENTION

The invention relates to a method for increasing the availability and redundancy of an analog current output as well as an analog current output with increased availability and redundancy.

BACKGROUND OF INVENTION

Such a method and analog current output can be used for all modules, with which a high level of availability is required or desirable, as is frequently the case for example for automation components.

Until now the redundancy of a module was typically realized by the parallel connection of two outputs. Here one output behaves in a practically passive manner, until a fault is identified in the first output. A switch is then made to the second, redundant output. Another variant consists of the permanent connection of both outputs with half the current respectively and disconnection of the defective output while at the same time increasing the current at the intact output.

SUMMARY OF INVENTION

An object of the invention is to improve the availability and also the redundancy behavior of an analog current output.

This object is achieved by a method for increasing the availability and redundancy of an analog current output,
- with a first set of current sources being switched to active to generate an output current,
- with one current source respectively of the first set being checked cyclically for serviceability and the other current sources respectively generating the output current in equal parts and
- where unserviceability is determined, the corresponding current source being disconnected and removed from the first set.

The object is further achieved by an analog current output. According to the invention the generation of the output current in equal parts is allocated to a number of current sources, which together with an additional current source form a first set, with the result that one current source respectively can be checked cyclically for serviceability, without the output current being adversely affected as a result. If a malfunction occurs, such as a failure of a current source for example, the output current advantageously does not drop out completely due to the allocation of generation to a number of current sources. The cyclical checking of the current sources allows the unserviceable current source to be removed quickly from the first set, with the remaining current sources still being able to supply the full output current, without being exposed to a greater load due to increased energy output. Error identification and switching therefore take practically no time, resulting in a continuous flow of current without interruptions.

In an advantageous form of the refinement a second set of current sources is kept ready in an inactive state and when a current source is removed from the first set, a current source from the second set is switched to active and assigned to the first set. Availability and redundancy can be adjusted finely in any manner, depending on the number of inactive (in other words additional) current sources.

In a further advantageous embodiment one current source respectively from the second set is checked cyclically for serviceability. It can therefore be assumed that a current source functions when it is connected.

In a further advantageous embodiment the current source from the second set switched to active and assigned to the first set is checked immediately after the unserviceable current source is disconnected. Depending on the length of a cycle step for checking a current source, this can take place either in the step following disconnection, if the length of a cycle step corresponds essentially to the time required for a check, or even in the same step as disconnection, if a cycle step lasts at least twice as long as the time required for a check. In any case it is thus ensured that the current source switched to active and assigned to the first set is serviceable.

In a further advantageous embodiment a programmable circuit is used to control the described sequence. Control here can be effected both by a general controller and by a specific sequence controller, such as an ASIC (Application Specific Integrated Circuit) for example or an FPGA (Field Programmable Gate Array).

In a further advantageous embodiment the analog current output is embodied as an integrated circuit. In this instance the sequence controller for example can be integrated on the chip and configured in a cascadable manner, thereby improving availability compared with an external controller. With one cascading option the controller can also be designed in a redundant manner, further increasing reliability.

In a further advantageous embodiment a second controller is provided in a redundant manner in respect of the first controller. This increases the availability of the analog current output further.

In a further advantageous embodiment a warning message is output after an adjustable number of unserviceable current sources. In the event that only a first set with only one redundant current source is present, the adjustable number is expediently selected as one. If however the embodiment has a second set of additional current sources, the number can for example be selected so that the warning is given early enough for it to be possible to replace the module at the next maintenance date.

BRIEF DESCRIPTION OF THE DRAWING

The invention is described in more detail below with reference to the exemplary embodiment shown in the FIGURE.

DETAILED DESCRIPTION OF INVENTION

FIG. 1 shows an inventive analog current output, which has by way of example eight current sources IS1-IS8, in a simplified diagram, which only shows the essential parts and the positive current sources IS1-IS8. Each of the current sources IS1-IS8 supplies a quarter of the output current Iout. As shown there are four current sources IS1-IS4 in circuit, supplying four times the current value of the individual source to Iout. The current source IS5 is also active but does not contribute to the total current Iout. The current sources IS1-IS5 form a first set of current sources, which are switched to active to generate an output current Iout, in other words the switches SW11-SW15 are closed. The current sources IS6-IS8 form a second set of current sources, which are kept ready in an inactive state, in other words the switches SW16-SW18 are open. According to the invention the five active current sources IS1-IS5 are switched cyclically by way of a corresponding logic as follows to the current output Iout by means of the changeover switches SW1-SW5: four current sources (IS1-IS4 in the diagram) respectively to Iout and one current source IS5 to the resistor Rv. For the current source IS5 switched to Rv a setpoint/actual comparison is carried out by means of Rv, the reference source IR and the error amplifier EA. In this way all the active current sources IS1-IS5 are checked once within a cycle and the result is made available by way of the error output Err for evaluation. If an error is identified, the defective, in other words unserviceable, current source (e.g. IS5) is disconnected immediately by way of the corresponding switch (e.g. SW15) and a hitherto inactive current source, for example IS6, is connected by means of SW16. The function of the newly connected current source IS6 is then advantageously first tested and the cycle for checking serviceability then continues excluding the defective and including the connected current source IS6. In the event that the function check on a current source IS5 only takes half the time provided for operation of the active current sources IS1-IS4, in other words one cycle step, the current source originating from the second set and now switched to active and assigned to the first set, e.g. IS6, can also be tested within the cycle step, in which failure of the current source IS5 was determined. Error identification and switching therefore take practically no time, resulting in a continuous current flow without interruptions. Availability and redundancy can be adjusted finely in any manner—depending on the number of inactive current sources IS6-IS8. The entire sequence can hereby be controlled both by a general controller and by a specific sequence controller, such as an ASIC (Application Specific Integrated Circuit) for example or an FPGA (Field Programmable Gate Array). If the analog current output is embodied as an integrated circuit, the sequence controller for example can be integrated therein.

To summarize, the invention relates to a method for increasing the availability and redundancy of an analog current output as well as an analog current output with increased availability and redundancy. To improve the availability and also the redundancy behavior of an analog current output, it is proposed that a first set of current sources be switched to active to generate an output current, one current source respectively of the first set being checked cyclically for serviceability and the other current sources respectively generating the output current in equal parts and where unserviceability is determined, the corresponding current source being disconnected and removed from the first set. If a malfunction occurs, such as a failure of a current source for example, the output current advantageously does not drop out completely due to the allocation of generation to a number of current sources. The cyclical checking of the current sources allows the unserviceable current source to be removed quickly from the first set, with the remaining current sources still being able to supply the full output current, without being exposed to a greater load due to increased energy output. Error identification and switching therefore take practically no time, resulting in a continuous flow of current without interruptions.

The invention claimed is:

1. A method for increasing the availability and redundancy of an analog current output, comprising:
   activating a first set of current sources to generate an output current;
   checking a current source of the first set cyclically for serviceability;
   generating the output current in equal parts by the other current sources of the first set; and
   disconnecting and removing the checked current source if an unserviceability of the checked current source is determined.

2. The method as claimed in claim 1, wherein a second set of current sources are in an inactive state, and wherein when a current source is removed from the first set a current source from the second set is switched to active and is assigned to the first set.

3. The method as claimed in claim 2, wherein one current source respectively from the second set is checked cyclically for serviceability.

4. The method as claimed in claim 2, wherein the current source from the second set switched to active and assigned to the first set is checked after the unserviceable current source is disconnected.

5. The method as claimed in claim 3, wherein the current source from the second set switched to active and assigned to the first set is checked after the unserviceable current source is disconnected.

6. The method as claimed in claim 1, wherein a programmable circuit is used to control the method.

7. The method as claimed in claim 1, wherein the analog current output is based upon an integrated circuit.

8. The method as claimed in claim 1, wherein a warning message is generated after an adjustable number of unserviceable current sources is reached.

9. An analog current output, comprising:
   a first set of current sources for generating an output current;
   a checking device for a cyclical check of one current source respectively of the first set for serviceability;
   a switching device for switching the current sources to generate the output current by the other current sources of the first set respectively in equal parts; and
   a disconnecting device to disconnect an unserviceable current source to remove it from the first set.

10. An analog current output as claimed in claim 9, wherein a first controller controls the checking device, the switching device and the disconnecting device.

11. The analog current output as claimed in claim 9, wherein a second set of current sources is in an inactive state, wherein a current source of the second set is assigned via a assigning device to the first set, when an unserviceable current source is removed from the first set.

12. The analog current output as claimed in claim 11, wherein a cyclical checking of one current source respectively of the second set for serviceability is provided.

13. The analog current output as claimed in claim 10, wherein the first controller is a programmable circuit.

14. The analog current output as claimed in claim 9, wherein the analog current output is based on an integrated circuit.

15. The analog current output as claimed in claim 10, wherein a second controller is redundant in respect of the first controller.

16. The analog current output as claimed in claim 9, further comprising a warning device to output a warning message after determining a number of unserviceable current sources.

17. The analog current output as claimed in claim 16, wherein the number of unserviceable current sources is adjustable.

18. Automation component with an analog current output, comprising:
   a first set of current sources for generating an output current;
   a checking device for a cyclical check of one current source respectively of the first set for serviceability;

a switching device for switching the current sources to generate the output current by the other current sources of the first set respectively in equal parts; and a disconnecting device to disconnect an unserviceable current source to remove it from the first set.

19. Automation component as claimed in claim 18, wherein a second set of current sources is in an inactive state, wherein a current source of the second set is assigned to the first set, when an unserviceable current source is removed from the first set.

20. Automation component as claimed in claim 19, further comprising a warning device to output a warning message after determining a number of unserviceable current sources, wherein the number of unserviceable current sources is adjustable.

\* \* \* \* \*